(12) United States Patent
Chang et al.

(10) Patent No.: US 9,530,732 B1
(45) Date of Patent: Dec. 27, 2016

(54) EFFICIENT LAYOUT PLACEMENT OF A DIODE

(71) Applicant: Vanguard International Semiconductor Corporation, Hsinchu (TW)

(72) Inventors: Hsiung-Shih Chang, Taichung (TW); Pei-Heng Hung, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/750,451

(22) Filed: Jun. 25, 2015

(51) Int. Cl.
*H01L 23/528* (2006.01)
*H01L 29/861* (2006.01)

(52) U.S. Cl.
CPC ......... *H01L 23/528* (2013.01); *H01L 29/8611* (2013.01)

(58) Field of Classification Search
CPC .......................... H01L 23/528; H01L 29/8611
See application file for complete search history.

(56) References Cited

U.S. PATENT DOCUMENTS

| | | | | |
|---|---|---|---|---|
| 2004/0016971 | A1* | 1/2004 | Abe | H01L 29/0692 257/365 |
| 2006/0086991 | A1* | 4/2006 | Barthelmess | H01L 21/263 257/401 |
| 2007/0029634 | A1* | 2/2007 | Schulze | H01L 29/0619 257/482 |
| 2008/0315343 | A1* | 12/2008 | Kitagawa | H01L 29/407 257/488 |
| 2011/0089518 | A1* | 4/2011 | Murshid | H01L 27/1446 257/448 |
| 2013/0037852 | A1* | 2/2013 | Tamaki | H01L 29/7811 257/139 |
| 2014/0267945 | A1 | 9/2014 | Lee et al. | |

FOREIGN PATENT DOCUMENTS

| TW | 201006963 A | 2/2010 |
|---|---|---|
| TW | 201033868 A1 | 9/2010 |
| TW | 201338118 A | 9/2013 |

* cited by examiner

*Primary Examiner* — Fernando L Toledo
*Assistant Examiner* — Neil Prasad
(74) *Attorney, Agent, or Firm* — Birch, Stewart, Kolasch & Birch, LLP

(57) ABSTRACT

A semiconductor device includes a plurality of first wires and a plurality of second wires. Each of the first wires forms a closed polygon and surrounds a center. Each of the second wires is forming the closed polygon and surrounding the center. The first and second wires are interlaced, and none of the first wires and second wires are coupled to each other.

7 Claims, 3 Drawing Sheets

EFFICIENT LAYOUT PLACEMENT OF A DIODE

BACKGROUND OF THE INVENTION

Field of the Invention

The disclosure relates generally to a layout placement, and more particularly relates to a layout placement of a diode.

Description of the Related Art

With the rapid development of electronic devices, power consumption has increased accordingly. Taking the diode as an example: as power consumption increases, so does the driving current of the diode. However, the diode's driving current is proportional to the junction perimeter, so the area of the diode should be increased accordingly. Therefore, how to enlarge the effective junction perimeter of a diode by efficiently enlarging the area is a problem that urgently needs to be solved.

BRIEF SUMMARY OF THE INVENTION

For solving the problem described above, the invention provides an effective layout placement of a diode.

An embodiment of a semiconductor device comprises a plurality of first wires and a plurality of second wires. Each of the first wires is forming a closed polygon and surrounding a center. Each of the second wires is forming the closed polygon and surrounding the center. The first wires and the second wires are interlaced, and none of the first wires and second wires are coupled to each other.

In an embodiment, the semiconductor device further comprises a plurality of third wires and a plurality of fourth wires. The third wires are laid on top of the first wires and the second wires, and are radially stretched outward from the center. The fourth wires are laid on top of the first wires and the second wires, and are radially stretched outward from the center.

In an embodiment, each of the third wires and each of the fourth wires are interlaced and are not coupled to each other. The closed polygon is equally divided by the third wires and the fourth wires.

In an embodiment, the third wires are coupled to each other at the center and a first connection point, and the fourth wires are coupled to each other at a second connection point. The first connection point and the second connection point are located outside of the closed polygon formed by the first wires and the second wires.

In an embodiment, the semiconductor device further comprises a plurality of fifth wires and a plurality of sixth wires. The fifth wires are laid on the top of the first wires. The fifth wires are coupled to the third wires, and there is a predetermined gap between the fifth wires and the fourth wires.

The sixth wires are laid on the top of the second wires. The sixth wires are coupled to the fourth wires, and there is the predetermined gap between the sixth wires and the third wires.

In an embodiment, the fifth wires are electrically coupled to the first wires and the sixth wires are electrically coupled to the second wires.

In an embodiment, the closed polygon is a regular polygon, a circle, or an ellipse.

In an embodiment, each of the first wires is coupled to a P-type doping layer of a diode, and each of the second wires is coupled to an N-type doping layer of the diode.

In an embodiment, the first wires are configured to an anode of the diode, and the second wires are configured to a cathode of the diode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
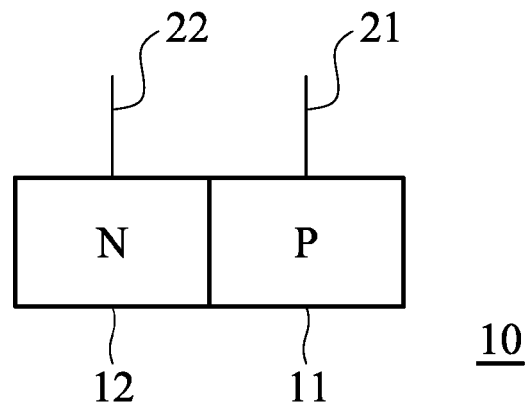
FIG. 1 is a cross-sectional view of a diode in accordance with an embodiment of the invention.

FIG. 1 is a cross-sectional view of a diode in accordance with an embodiment of the invention. As shown in FIG. 1, the diode 10 includes the P-type doping layer 11 and the N-type doping layer 12. The P-type doping layer 11 is coupled to the first wire 21, and the N-type doping layer 12 is coupled to the second wire 22. According to an embodiment of the invention, the diode 10 is a Shottky diode. According to another embodiment of the invention, the diode 10 is a fast recovery diode.

Figure 2:
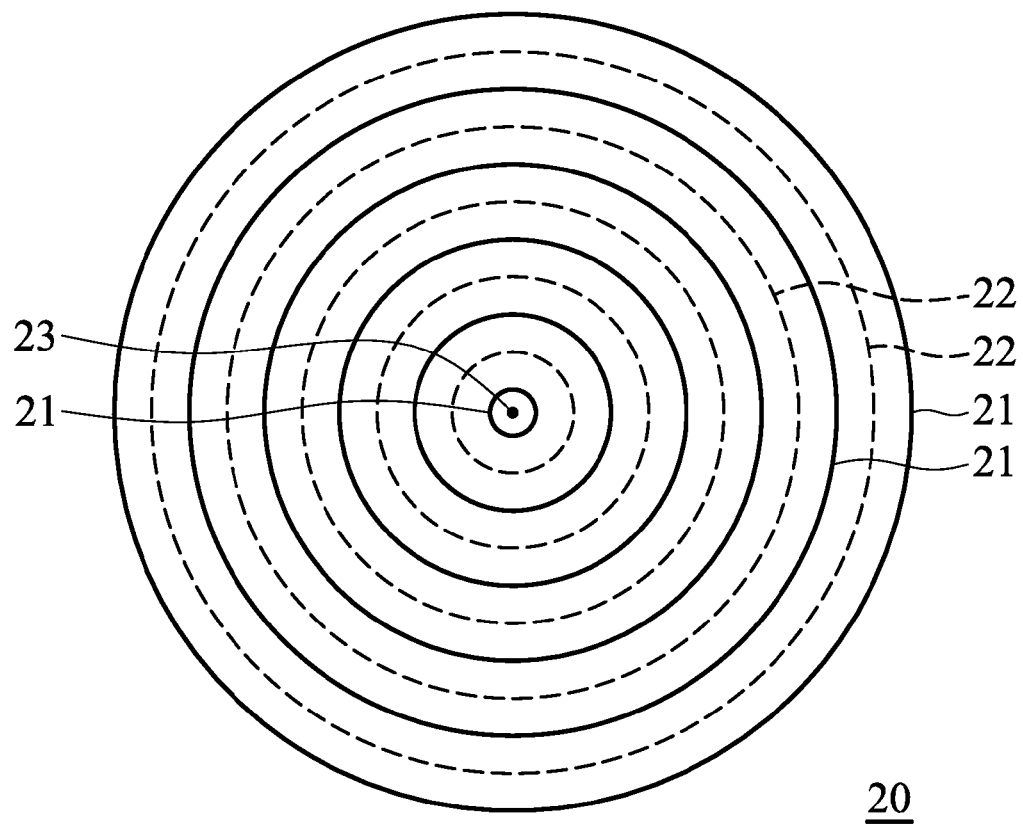
FIG. 2 is a top view of a diode in accordance with an embodiment of the invention.

FIG. 2 is a top view of a diode in accordance with an embodiment of the invention. As shown in FIG. 2, the diode 20 includes a plurality of first wires 21 and a plurality of second wires 22. Each of the first wires 21 and the second wires 22 is forming a closed polygon, and each of the first wires 21 and the second wires 22 is surrounding the center 23.

According to an embodiment of the invention, each of the first wires 21 is stacked on the P-type doping layer and coupled to the P-type doping layer, and each of the second wires 22 is stacked on the N-type doping layer and coupled to the N-type doping layer. According to another embodiment of the invention, each of the first wires 21 is stacked on the N-type doping layer and coupled to the N-type doping layer, and each of the second wires 22 is stacked on the P-type doping layer and coupled to the P-type doping layer.

According to an embodiment of the invention, the closed polygon is a regular quadrangle, a regular hexagon, a regular octagon, a regular hexadecagon, a circle, an ellipse, or any other regular polygon. According to another embodiment of the invention, the closed polygon could be any other closed shape. According to the embodiment of FIG. 1, the first wires 21 and the second wires 22 are forming a concentric circle surrounding the center 23.

As shown in FIG. 2, the first wires 21 and the second wires 22 are interlaced, and none of the first wires 21 and second wires 22 are coupled to each other. According to an embodiment of the invention, each of the second wires 22 is inserted between two of the first wires 21, and the outermost circle is the first wire 21. According to another embodiment of the invention, the outermost circle is the second wire 22, and each of the first wires 21 is inserted between two of the second wires 22.

According to an embodiment of the invention, there is a pitch between any two of the first wires 21 and the second wires 22, and the minimum of the pitch is determined according to the design rule of the semiconductor manufacturing process. According to an embodiment of the invention, since the first wires 21 and the second wires 22 respectively represent the anode and the cathode of the diode 20, the first wires 21 and the second wires 22 are not coupled to each other, thereby preventing the occurrence of a short circuit.

Figure 3:
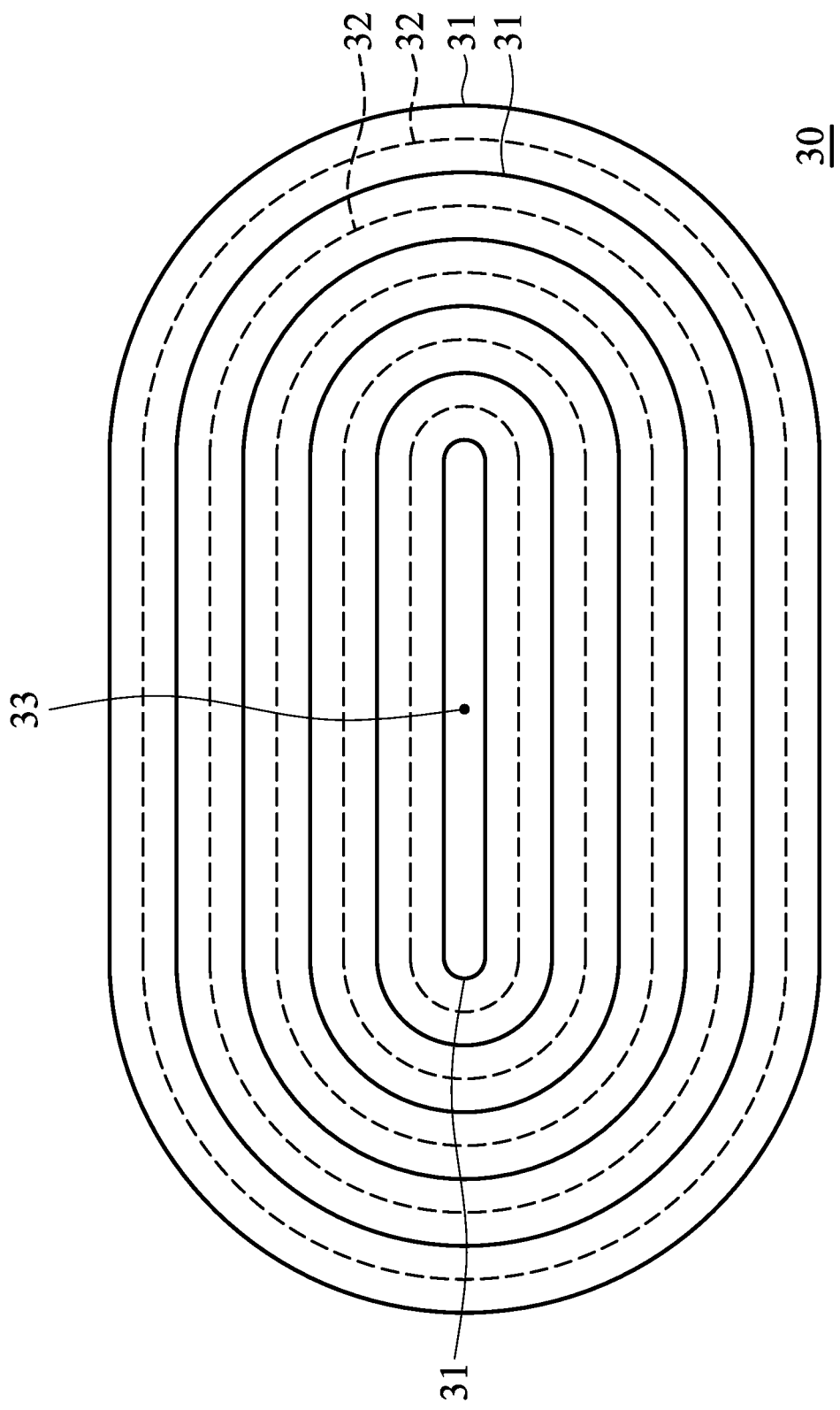
FIG. 3 is a top view of a diode in accordance with another embodiment of the invention.

FIG. 3 is a top view of a diode in accordance with another embodiment of the invention. As shown in FIG. 3, the diode 30 includes a plurality of first wires 31 and a plurality of second wires 32. Each of the first wires 31 and the second wires 32 is forming an ellipse, and each of the first wires 31 and the second wires 32 is surrounding the center 33.

According to an embodiment of the invention, each of the first wires 31 is stacked on the P-type doping layer and coupled to the P-type doping layer, each of the second wires 32 is stacked on the N-type doping layer and coupled to the N-type doping layer. According to another embodiment of the invention, each of the first wires 31 is stacked on the N-type doping layer and coupled to the N-type doping layer, and each of the second wires 32 is stacked on the P-type doping layer and coupled to the P-type doping layer.

As shown in FIG. 3, the first wires 31 and the second wires 32 are interlaced, and none of the first wires 31 and second wires 32 are coupled to each other. According to an embodiment of the invention, each of the second wires 22 is inserted between two of the first wires 31, and the outermost circle is one of the first wires 31. According to another embodiment of the invention, the outermost circle is one of the second wires 32, and each of the first wires 31 is inserted between two of the second wires 32.

According to an embodiment of the invention, there is a pitch between any two of the first wires 31 and the second wires 32, and the minimum of the pitch is determined according to the design rule of the semiconductor manufacturing process. According to an embodiment of the invention, since the first wires 31 and the second wires 32 respectively represent the anode and the cathode of the diode 30, the first wires 31 and the second wires 32 are not coupled to each other, eliminating the risk of a short circuit.

Figure 4:
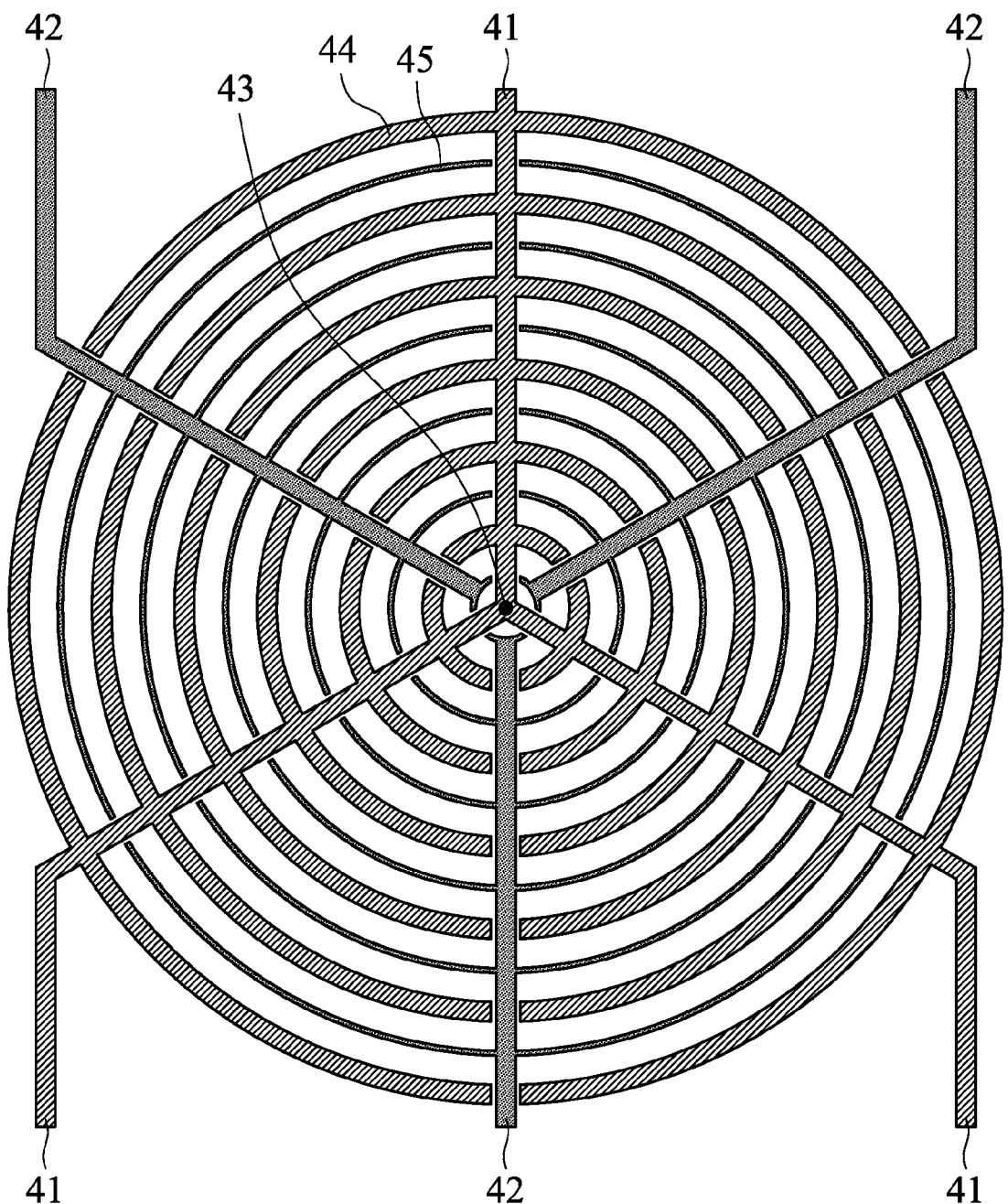
FIG. 4 is a top view of the layout of a diode in accordance with an embodiment of the invention.

FIG. 4 is a top view of the layout of a diode in accordance with an embodiment of the invention. In order to explain the technical features of the invention in detail, the following description of FIG. 4 will be accompanied with FIG. 2 for further explanation. As shown in FIG. 4, the diode 40 further includes a plurality of third wires 41, a plurality of fourth wires 42, a plurality of fifth wires 44, and a plurality of sixth wires 45. The third wires 41, the fourth wires 42, the fifth wires 44, and the sixth wires 45 are placed on the first wires 21 and the second wires 22 of FIG. 2.

According to an embodiment of the invention, the third wires 41 and the fourth wires 42 are radially extended outward from the center 43, and the third wires 41 and the fourth wires 42 are not coupled to each other. According to an embodiment of the invention, the concentric circle formed by the first wires 21 and the second wires 22 in FIG. 2 are equally divided by the third wires 41 and the fourth wires 42.

As shown in FIG. 4, the diode 40 has three third wires 41 and three fourth wires 42. The diode 40 is equally divided into six equal parts by the third wires 41 and the fourth wires 42. According to another embodiment of the invention, the closed polygon formed by the first wires 21 and the second wires 22 in FIG. 2 can be equally divided into any number of equal parts.

The fifth wires 44 are laid on the top of the first wires 21 in FIG. 2, and the fifth wires 44 are electrically coupled to the first wires 21 in FIG. 2. The fifth wires 44 are coupled to the third wires 41, and there is a predetermined gap between the fifth wires 44 and the fourth wires 42. According to an embodiment of the invention, the minimum of the predetermined gap is determined according to the design rule of the semiconductor manufacturing process.

The sixth wires 45 are laid on the top of the second wires 22 in FIG. 2, and the sixth wires 45 are electrically coupled to the second wires 22 in FIG. 2. The sixth wires 45 are coupled to the fourth wires 42, and there is a predetermined gap between the sixth wires 45 and the third wires 41. According to an embodiment of the invention, the minimum of the predetermined gap is determined according to the design rule of the semiconductor manufacturing process.

As shown in FIG. 4, the third wires 41 are coupled to each other at the center 43. According to another embodiment of the invention, the fourth wires 42 are coupled to each other at the center 43. According to an embodiment of the invention, the third wires 41 and the fourth wires 42 are respectively coupled to the first connection point and the second connection point which are located outside of the closed polygon formed by the first wires 21 and the second wires 22 in FIG. 2.

According to an embodiment of the invention, the first wires 21 in FIG. 2 are coupled to the P-type doping layer 11 in FIG. 1, and the second wires 22 are coupled to the N-type doping layer 12. Therefore, the third wires 41 coupled to the first connection point and the fourth wires 42 coupled to the second connection point means that the first connection point is coupled to the P-type doping layer 11 and the second connection point is coupled to the N-type doping layer 12, such that the first connection point is configured to the anode of the diode while the second connection point is configured to the cathode of the diode. According to another embodiment of the invention, each of the first and second connection points can be either the anode or the cathode of the diode by changing the connection.

According to an embodiment of the invention, the first wires 21 and the second wires 22 shown in FIG. 2 and the first wires 31 and the second wires 32 shown in FIG. 3 are in the metal-1 layer of a semiconductor manufacturing process. The first wires 21 and the second wires 22 or the first wires 31 and the second wires 32 are respectively coupled to the P-type doping layer 11 and the N-type doping layer 12 by the contact layer.

According to another embodiment of the invention, the first wires 21 and the second wires 22 shown in FIG. 2 are in the metal-1 layer of a semiconductor manufacturing process, and the first wires 21 and the second wires 22 are also respectively coupled to the N-type doping layer 12 and P-type doping layer 11 by the contact layer.

According to an embodiment of the invention, the third wires 41, the fourth wires 42, the fifth wires 44, and sixth wires 45 in FIG. 4 are in the top metal layer of a semiconductor manufacturing process, and the third wires 41, the fourth wires 42, the fifth wires 44, and the sixth wires 45 are coupled to either the first wires 21 or the second wires 22 in FIG. 2 or either the first wires 31 or the second wires 32 in FIG. 3.

According to another embodiment of the invention, the third wires 41, the fourth wires 42, the fifth wires 44, and sixth wires 45 in FIG. 4 are in any metal layer above the first metal layer. According to another embodiment of the invention, the first wires 21 and the second wires 22 shown in FIG. 2 and the first wires 31 and the second wires 32 shown in FIG. 3 are not limited to being any particular metal layer. That is, the third wires 41, the fourth wires 42, the fifth wires 44, and the sixth wires 45 could be any one of the metal layers which are laid on the top of the first wires 21 and the second wires 22 shown in FIG. 2 and the first wires 31 and the second wires 32 shown in FIG. 3.

According to an embodiment of the invention, the layout placement shown in FIGS. 2-4 is also applied to a Metal-Oxide-Semiconductor Field-Effect Transistor (MOSFET).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
    a plurality of first wires, wherein each of the first wires is forming a closed loop and surrounding a center;
    a plurality of second wires, wherein each of the second wires is forming the closed loop and surrounding the center, wherein the first wires and the second wires are interlaced, and none of the first wires and second wires are coupled to each other, wherein the closed loop is an ellipse;
    a plurality of third wires, laid on top of the first wires and the second wires, and radially stretched outward from the center;
    a plurality of fourth wires, laid on top of the first wires and the second wires, and radially stretched outward from the center;
    wherein each of the first wires is coupled to a P-type doping layer of a diode, and each of the second wires is coupled to an N-type doping layer of the diode; and
    wherein the first wires are configured to an anode of the diode, and the second wires are configured to a cathode of the diode.

2. The semiconductor device of claim 1, wherein each of the third wires and each of the fourth wires are interlaced and are not coupled to each other, wherein the closed loop is equally divided by the third wires and the fourth wires.

3. The semiconductor of claim 2, wherein the third wires are coupled to each other at the center and a first connection point, and the fourth wires are coupled to each other at a second connection point, wherein the first connection point and the second connection point are located outside of the closed loop formed by the first wires and the second wires.

4. The semiconductor device of claim 2, further comprising:
    a plurality of fifth wires, laid on the top of the first wires, wherein the fifth wires are coupled to the third wires, and there is a predetermined gap between the fifth wires and the fourth wires; and
    a plurality of sixth wires, laid on the top of the second wires, wherein the sixth wires are coupled to the fourth wires, and there is the predetermined gap between the sixth wires and the third wires.

5. The semiconductor device of claim 4, wherein the fifth wires are electrically coupled to the first wires and the sixth wires are electrically coupled to the second wires.

6. The semiconductor device of claim 1, wherein the closed loop is a circle.

7. The semiconductor device of claim 1, wherein the closed loop is a regular polygon.

\* \* \* \* \*